United States Patent [19]
Lee

[11] Patent Number: 5,568,078
[45] Date of Patent: Oct. 22, 1996

[54] CLOCK DELAY COMPENSATING AND DUTY CONTROLLING APPARATUS OF A PHASE-LOCKED LOOP

[75] Inventor: Seung Y. Lee, Seoul, Rep. of Korea

[73] Assignee: Hyundai Electronics Industries Co., Ltd., Kyoungki-Do, Rep. of Korea

[21] Appl. No.: 464,324

[22] Filed: Jun. 5, 1995

[30] Foreign Application Priority Data

Dec. 30, 1994 [KR] Rep. of Korea .................. 94-39868

[51] Int. Cl.[6] ................... H03L 7/00; H03K 5/159
[52] U.S. Cl. .................. 327/262; 327/261; 327/141;
327/149; 327/147; 327/156; 327/158; 327/175;
327/291; 327/292; 331/25
[58] Field of Search .................................. 327/147, 149,
327/155, 146, 158, 156, 172, 175, 292,
291, 362, 141, 261, 262; 331/18, 25

[56] References Cited

U.S. PATENT DOCUMENTS 5,008,636 4/1991 Markinson et al. ................ 331/2
5,118,975 6/1992 Hillis et al. ..................... 327/158
5,329,599 7/1994 Curry et al. ..................... 382/54

FOREIGN PATENT DOCUMENTS 6-309799 11/1994 Japan.

Primary Examiner—Timothy P. Callahan
Assistant Examiner—Dinh T. Le
Attorney, Agent, or Firm—Fish & Richardson P.C.

[57] ABSTRACT

For clock delay compensation and duty control of a phase-locked loop in a decoder of a video signal receiving system, phases of two input clocks received into a phase comparative detector are compared to divide a reference clock from an oscillator of the phase comparative detector for obtaining a resultant phase error output in a divider in accordance with the result of the phase comparison, a duty ratio of the output clock therefrom is controlled in a duty controller to allow the phase comparative detector to be utilized free from the duty ratio of the clock, and a clock delay compensator performs correction of clock delay compensation of the system operated at high speed in the synchronized phase-locked loop, thereby controlling a duty ratio of a signal divided in the divider when determining accuracy, frequency and stabilization in the duty controller, and correcting an error in delay time by adding the clock delay compensator.

2 Claims, 2 Drawing Sheets

CLOCK DELAY COMPENSATING AND DUTY CONTROLLING APPARATUS OF A PHASE-LOCKED LOOP

BACKGROUND OF THE INVENTION

1. Field of the Invention

The present invention relates to clock delay compensating and duty controlling apparatus of a phase-locked loop (hereinafter simply referred to as "PLL") in a decoder of a video signal receiving system, and more particularly to a duty controller and a clock delay compensator of a PLL, in which phases of two input clocks received into a phase comparative detector are compared to divide a reference clock from an oscillator of the phase comparative detector for obtaining a resultant phase error output in a divider in accordance with the result of the phase comparison, a duty ratio of the output clock therefrom is controlled in a duty controller to allow the phase comparative detector to be utilized free from the duty ratio of the clock, and a clock delay compensator performs correction of clock delay compensation of a system operated at high speed in the synchronized PLL.

2. Description of the Prior Art

A conventional PLL necessarily employs a phase comparative controller in a limited way due to the reason that a duty ratio should be considered when dividing a clock from an oscillator or voltage-controlled oscillator (VCO). Moreover, the phase comparative detector of the PLL must utilize a spherical wave having a duty ratio of 50% of two comparative input clocks received thereto, with a smaller duty ratio of two comparative input clocks received to other phase comparative detector being preferable. Therefore, a great difference between two comparative input clocks received into the phase comparative detector may cause an error. As a result, the phase comparative detector should be used in a restricted manner.

Furthermore, a comparative phase-difference voltage of the phase comparative detector controls a VCO for actuating first division, second division, multistep division, and inherent logic delay to utilize an output frequency of the phase-synchronized VCO synchronized with an oscillator, so that respective signal outputs have different clock delay times. At this time, an error in the delay time can cause problems in a system such as malfunction and inferior accuracy when the system is operated in high speed.

One example of the conventional PLL will be described with reference to FIG. 1.

The PLL includes an oscillator 20 for producing an oscillating clock within a video system, a divider 21 for dividing a reference clock generated by the oscillator 20, and a phase comparative detector 22 for receiving a clock passed through the divider 21. Also, a VCO 23 is controlled to generate a clock signal from the phase comparative detector 22, a divider 24-1 divides the clock signal generated by the VCO 23, and a dividing circuit portion 25 receives and repeatedly divides a clock divided in the divider 24-1 via the phase comparative detector 22 and VCO 23.

In the conventional PLL formed as above, the reference clock A1 generated the oscillator 20 passes through the divider 21 and is supplied to the phase comparative detector 22. The clock A5 generated by the VCO 23 is divided and provided to the phase comparative detector 22, so that a phase error output A4 from the phase comparative detector 22 (which compares two signal inputs A2 and A3) controls the VCO 23. Output A5 from the VCO is fed back to the phase comparative detector 22 via the divider 25.

Outputs A6, A7 and A8 simultaneously produced with the output A5 from the divider 25 is supplied to a picture receiver (not shown).

On the other hand, a comparative phase-difference voltage A4 controls the VCO 23, so that an output frequency of the phase-synchronized VCO 23 which is in sync with the oscillator 20, is divided primarily 25-1 and 25-2 and secondarily 25-3 to have different clock delay times. Thus, the error in this delay time results in malfunction or inferior accuracy of the system when the system is operated at high speed.

More specifically, when the phase comparative detector of the PLL as illustrated in FIG. 1 is designed by an exclusive OR logic circuit, a phase comparator of the phase comparative detector formed of the exclusive OR logic circuit must receive signals having a spherical wave characteristic and a duty ratio, of 50% at its two input terminals to this. In addition when the phase comparative detector is designed with an RS flip-flop logic circuit, it is preferable that the duty ratio of the phase-compared clocks received by the two input terminals of the phase comparative detector be small. A larger duty ratio possibly causes an error. If the phase comparative detector is designed using part No. MC4044, Motorola, Co., LTD., a phase comparative detector supplies no output clock when the phases of two clocks received by the two input terminals of the phase comparative detector are commonly supplied.

A technique for reducing an error rate of a magnetic recording/reproducing apparatus is disclosed in Japanese Patent Publication Laid-open No. Hei 6-309799 entitled by "Magnetic Recording/Reproducing Apparatus". The magnetic recording/reproducing apparatus which uses amplitude phase modulation of a plurality of values includes a carrier-clock reproducer for reproducing a carrier wave and a clock by means of a playback signal, a carrier-clock delay controller for outputting a carrier-delay control signal to a carrier variable delay circuit and a clock-delay control signal to a clock variable delay circuit, based on a demodulation signal of two types from a demodulator, to control the delayed amount of the carrier wave and clock to make an error rate of a decoded digital signal be the lowest. In this magnetic recording/reproducing apparatus, the correction is performed on the basis of a signal recorded on a tape with a different carrier wave and phase while requiring no initial phase control of the carrier wave and clock, and an error rate is significantly decreased. However, the above-described conventional problems are not completely solved by this technique.

SUMMARY OF THE INVENTION

The present invention is devised to solve the above-described problems. Accordingly, it is an object of the present invention to provide a PLL capable of solving clock delay by adding a circuit for carrying out clock delay compensation.

To achieve the above object of the present invention, there is provided a phase-locked loop of a video signal receiving system including an oscillator, a divider, a phase comparative detector, a voltage-controlled oscillator, an M-divider, and a dividing circuit portion, further having a selector between an output terminal of the oscillator and an input terminal of an L-divider circuit and an output oscillated from the oscillator and an external oscillating clock, a first duty controller between an output terminal of the L-dividing circuit and an input terminal of the phase comparative detector for controlling a duty ratio, a second duty controller, between an input terminal of the M-divider for supplying an output to the phase comparative detector, and the voltage-controlled oscillator, and a clock delay circuit portion formed of at least one circuit corresponding to at least one dividing circuit for dividing an output frequency of the voltage-controlled oscillator controlled by an output of the phase comparative detector.

BRIEF DESCRIPTION OF THE DRAWINGS

The above objects and other advantages of the present invention will become more apparent by describing in detail preferred embodiments thereof with reference to the attached drawings in which.

DETAILED DESCRIPTION OF THE PREFERRED EMBODIMENT

Figure 1:
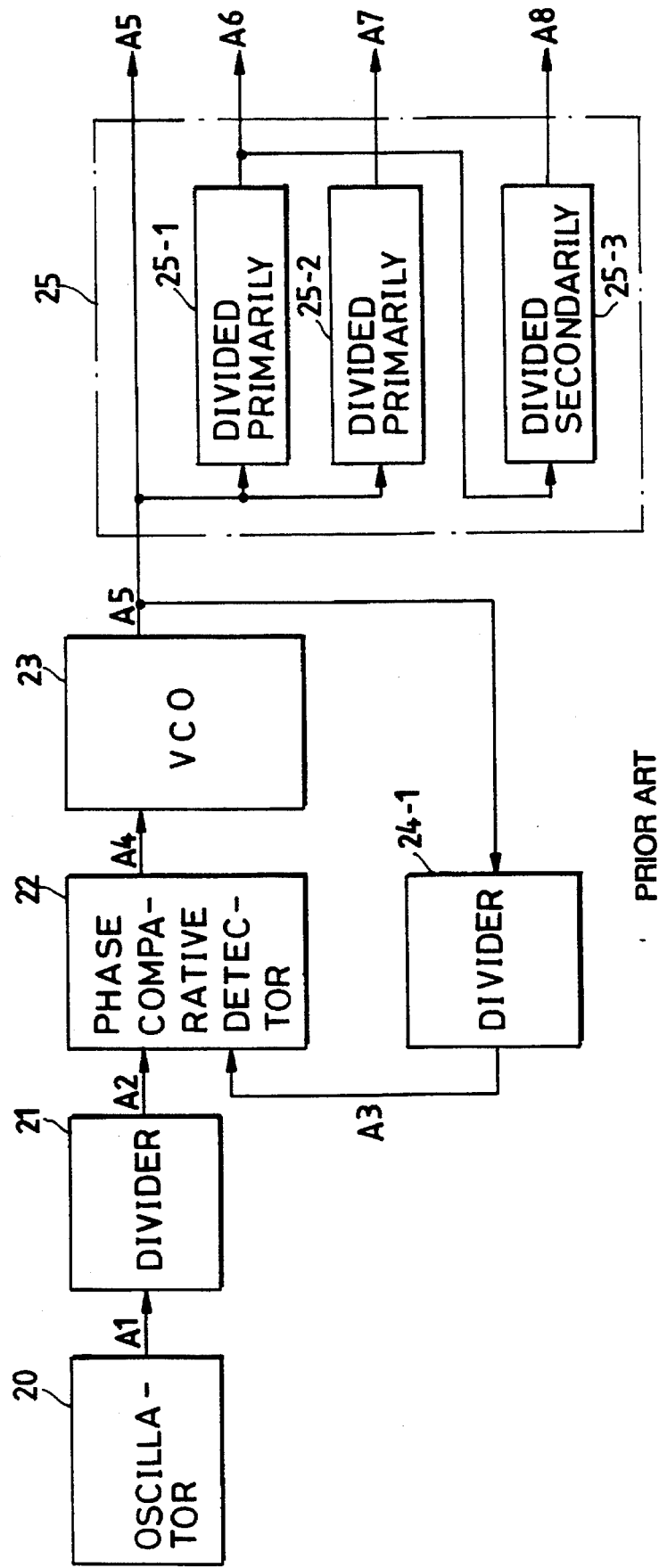
FIG. 1 is a block diagram showing a conventional phase-locked loop.
Figure 2:
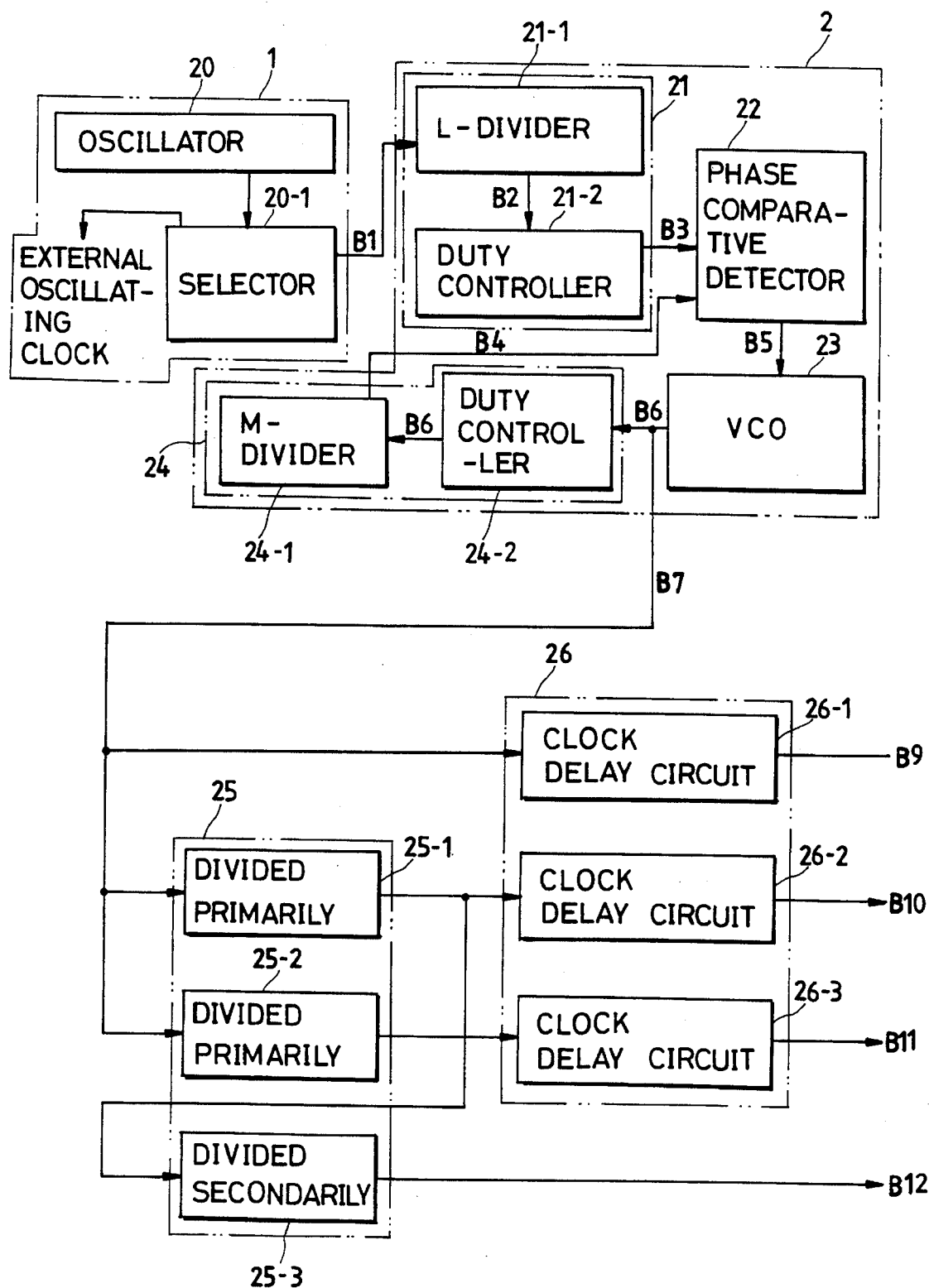
FIG. 2 is a block diagram showing a phase-locked loop according to the present invention.

Referring to FIG. 2, a PLL according to the present invention includes an oscillating output unit 1 having an oscillator 20 for generating an internal oscillating clock and a selector 20-1 for selecting an output oscillated from the oscillator 20 and an external oscillating clock. Also, a comparison control unit 2 has an L-divider 21-1, a duty controller 21-2, a phase comparative detector 22, a VCO 23, an M-divider 24-1, and a duty controller 24-2, thereby comparing to control clocks from the oscillating output unit 1. A dividing circuit unit 25 consists of at least one divider, i.e., N1-divider, N2-divider and N3-divider 25-1, 25-2 and 25-3 in this embodiment, for dividing an output frequency of the VCO 23. A clock delay circuit unit 26 consists of at least one clock delay circuit, i.e., three clock delay circuits 26-1, 26-2 and 26-3, in this embodiment for adjusting clock delay time divided in the dividing circuit unit 25 by as much as one period.

According to a clock delay compensator & a duty controller of the PLL constructed as above, an output B1 generated by the internal oscillator 20 and the external oscillating clock are selected by the selector 20-1, and the duty ratio of an output B2 divided in the L-divider 21-1 is controlled in the duty controller 21-2 to supply the result to the phase comparative detector 22. A phase error output B5 of the phase comparative detector 22 obtained by comparing two input signals B3 and B4 controls the VCO 23 which, in turn, effects feedback to the phase comparator detector 22 via the M-divider 24-1 and duty controller 24-2.

On the other hand, a comparative phase difference voltage B5 of the phase comparative detector 22 controls the VCO 23 to synchronize it with the oscillator 20, so that an output frequency B7 of the VCO 23 is divided primarily N1 & N2, and secondarily N3 to have different clock delay times for each output. Therefore, a circuit for carrying out clock delay compensation is added for adjusting the clock delay time by as much as one period time of the output B7 of the VCO 23.

In a PLL according to the present invention as described above, a duty ratio of a signal divided in a divider is controllable in a duty controller when determining accuracy, frequency and stabilization to solve a problem of restrictively employing a phase comparative detector. Furthermore, a duty ratio of two clocks of which phases are compared to each other is adjusted to solve a problem of restrictively employing a phase comparative controller. Also, a clock delay compensator is added to solve a problem of generating an error in delay time which results in malfunction or inferior accuracy of a system when the system is operated in high speed.

While the present invention has been particularly shown and described with reference to particular embodiment thereof, it will be understood by those skilled in the art that various changes in form and details may be effected therein without departing from the spirit and scope of the invention as defined by the appended claims.

What is claimed is:

1. A phase-locked loop circuit of a video signal receiving system comprising:

an oscillating circuit which generates a reference oscillating clock, an L-dividing circuit which divides the reference clock from said oscillating circuit, a phase comparative detecting circuit which receives a first clock signal from said L-dividing circuit, a voltage-controlled oscillating circuit which is controlled by a second clock signal from said phase comparative detecting circuit, an M-dividing circuit which divides a third clock signal from said voltage-controlled oscillating circuit and passes it to the phase comparative detecting circuit, and a dividing circuit portion including at least one dividing circuit, said dividing circuit portion coupled to the voltage-controlled oscillating circuit to divide the third clock signal;

a selecting circuit coupled between an output terminal of said oscillating circuit and an input terminal of said L-dividing circuit, said selecting circuit selecting said reference oscillating clock from said oscillating circuit and an external oscillating clock signal;

a first duty controlling circuit coupled between an output terminal of said L-dividing circuit and a first input terminal of said phase comparative detecting circuit, said first duty controlling circuit controlling a duty ratio of said first clock signal received by said L-dividing circuit;

a second duty controlling circuit coupled between an input terminal of said M-dividing circuit and a output of said voltage-controlled oscillating circuit, said second duty controlling circuit controlling a duty ratio of said third clock signal which is supplied to a second input terminal of said phase comparative detecting circuit through said M-dividing circuit; and a clock delay circuit portion coupled to said dividing circuit portion and said voltage-controlled oscillator circuit output, said clock delay circuit portion including at least one clock delay circuit to provide a delayed signal to an output of the phase-locked loop circuit.

2. The phase-locked loop circuit as claimed in claim 1, wherein said dividing circuit portion includes a plurality of dividing circuits, each receiving said third clock signal and said clock delay circuit portion compensates for different delay times of respective signals generated by said dividing circuits.

* * * * *